(12) United States Patent
Engholm

(10) Patent No.: US 7,199,818 B1
(45) Date of Patent: Apr. 3, 2007

(54) STATUS RIBBON FOR DISPLAY FOR MULTIPLE CHANNELS/CODES

(75) Inventor: Kathryn A. Engholm, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 366 days.

(21) Appl. No.: 09/633,687

(22) Filed: Aug. 7, 2000

(51) Int. Cl.
*H04N 17/00* (2006.01)

(52) U.S. Cl. ...................................... 348/184

(58) Field of Classification Search ........... 348/184, 348/185, 186, 189, 190, 191, 180; 702/76; 324/76.19, 76.47, 76.39, 76.55, 76.15, 76.24, 324/76.11, 76.12, 76.22; 345/830, 832, 833, 345/829, 784, 786
See application file for complete search history.

(56) References Cited

U.S. PATENT DOCUMENTS

| | | | |
|---|---|---|---|
| 4,685,065 A | | 8/1987 | Braun et al. |
| 4,870,348 A | * | 9/1989 | Smith et al. .............. 324/76.19 |
| 4,953,017 A | * | 8/1990 | Ivey et al. .................. 348/185 |
| 5,103,402 A | * | 4/1992 | Morton et al. ................ 702/76 |
| 5,262,957 A | * | 11/1993 | Hearn ......................... 702/76 |
| 5,291,285 A | * | 3/1994 | Yokoyama et al. .......... 348/180 |
| 5,577,067 A | * | 11/1996 | Zimmerman ................ 375/224 |
| 6,219,340 B1 | | 4/2001 | Cutler et al. |
| 6,233,529 B1 | * | 5/2001 | Nonaka ........................ 702/76 |
| 6,320,577 B1 | * | 11/2001 | Alexander ................ 345/440.1 |
| 6,353,313 B1 | * | 3/2002 | Estep et al. .................. 324/160 |
| 6,386,454 B2 | * | 5/2002 | Hecht et al. ........... 235/462.16 |
| 6,392,397 B1 | * | 5/2002 | Thomas .................... 324/76.11 |
| 6,519,227 B1 | * | 2/2003 | Koizumi ...................... 370/241 |

FOREIGN PATENT DOCUMENTS

FR 2782594 2/2000
JP A 2000-131356 5/2000

* cited by examiner

*Primary Examiner*—Paulos Natnael
(74) *Attorney, Agent, or Firm*—Francis I. Gray; Matthew D. Rabdau

(57) ABSTRACT

A status ribbon to display a signal characteristic for multiple channels/codes within a region of interest has a plurality of stripes. A value for each stripe is represented by a trait of the stripe, such as color or brightness. The trait may represent a range of a signal parameter or may represent a pass/caution/fail value for the signal parameter, or may represent code activity. A window may be used to select a subset of channels/codes for additional detail, the additional detail being displayed textually adjacent the status ribbon. Also a subsidiary status ribbon may be displayed for channels/codes where each stripe of the primary status ribbon represents more than one channel/code, each stripe in the subsidiary status ribbon representing a single channel/code.

12 Claims, 1 Drawing Sheet

STATUS RIBBON FOR DISPLAY FOR MULTIPLE CHANNELS/CODES

BACKGROUND OF THE INVENTION

The present invention relates to the display of signal characteristics, and more particulary to a status ribbon for display of signal characteristics for multiple channels/codes.

A band of frequencies may contain many channels of content, such as in cable television systems, or a single digital communications radio frequency (RF) channel may contain many codes, such as in wireless telephone systems. An operator trying to quickly assess the health of such systems would like a way to scan the power, or some other measurement parameter, for each channel or code and view the results in a single display. Such a single display of power for multiple channels of a cable television system is disclosed in U.S. Pat. No. 4,685,065 for a portable spectrum analyzer. In this implementation the single display consists of a bar graph where the channel number is along the horizontal axis and the power is along the vertical axis, with the height of the bar indicating the relative power for each of the channels. This display is limited on the number of channels that may be compacted into a signal view. Also this does not address the need to translate measured values into pass/fail values for easier interpretation for the operator.

Also for the digital communications RF channel with many content "codes", the operator may want to scan the activity for each code and view the results on the single display. However there may be more codes than a display device has pixels horizontally. Prior art does not represent multiple codes in a single indicator.

What is desired is an alternative display of signal characteristics for multiple channels/codes that compacts many more channels/codes into a single view, translates measured values into pass/fail values, and is intuitive for an operator, or alternatively compacts many codes within an RF channel into the single view so a single indicator represents multiple codes.

BRIEF SUMMARY OF THE INVENTION

Accordingly the present invention provides a status ribbon for display of signal characteristics for multiple channels/codes. The status ribbon has a plurality of stripes representing channels within a frequency range of interest or codes within a digital communications RF channel. A characteristic, such as color or brightness, of each stripe represents a value for the channel(s) or code(s), such as a value range, a pass/caution/fail condition value, code activity, power (maximum or average), spreading factor, etc. A draggable window also may be provided for selecting a subset of contiguous stripes for additional detail. The subset may be displayed textually adjacent the status ribbon and may include channel number, frequency, signal standard, etc. Also for stripes representing multiple channels/codes an additional status ribbon may be displayed which includes as separate stripes each channel/code within the window.

The objects, advantages and other novel features of the present invention are apparent from the following detailed description when read in conjunction with the appended claims and attached drawing.

DETAILED DESCRIPTION OF THE INVENTION

Figure 1:
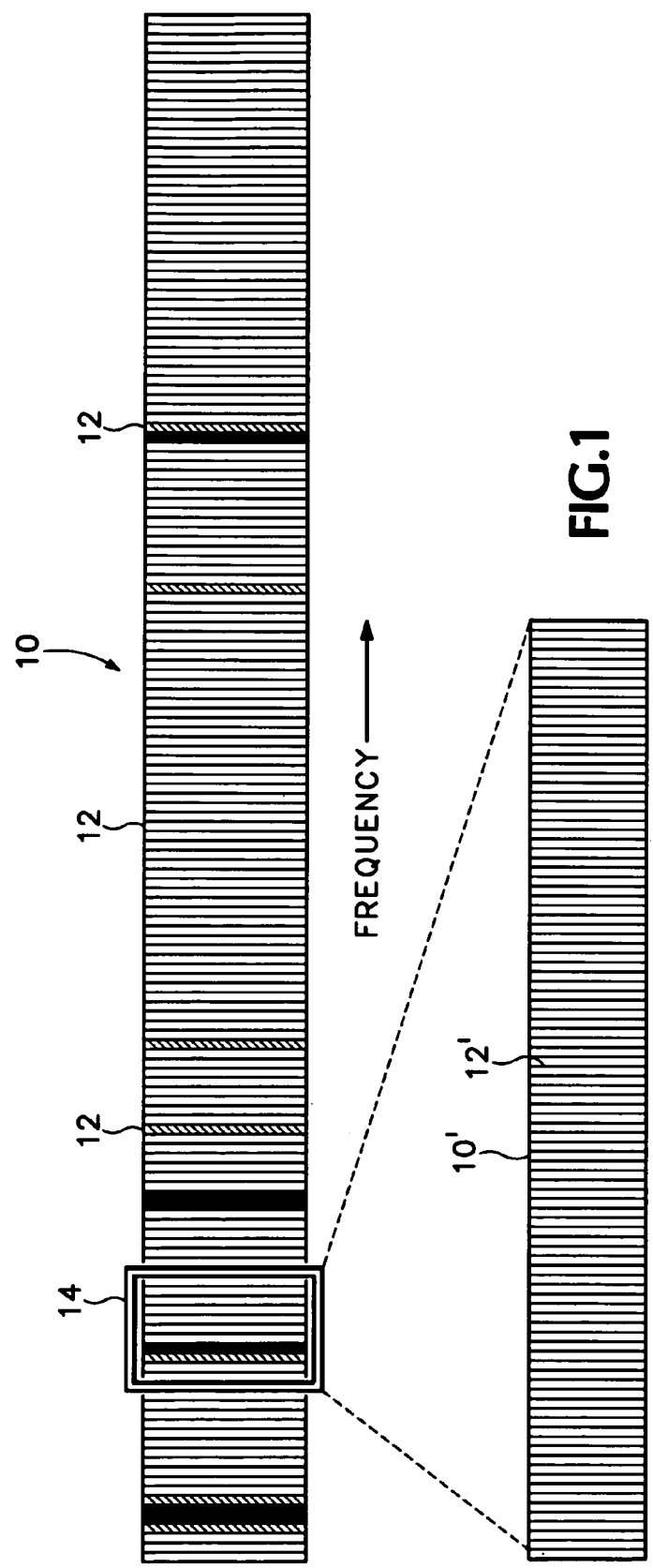
FIG. 1 is a plan view of a status ribbon for display of signal parameters for multiple channels according to the present invention.

Referring now to FIG. 1 a status ribbon 10 is shown having a band of vertical stripes 12, each stripe pertaining to one or more channels in a frequency range of interest or to one or more codes within a single digital communications RF channel. The color or brightness of the stripes represents a value for a signal parameter for the channel(s)/code(s), such as maximum or average power, or the presence or absence of activity in the codes each stripe covers. This value may be represented either as a scalar value according to a color gradient or as a converted status value, such as pass/caution/fail. For example for the grey scale example shown "white" may be equivalent to "pass", "grey" may be equivalent to caution and "black" may be equivalent to "fail." Or alternatively "white" may represent a value greater than 3 dB, "grey" may represent a value between 0–3 dB, and black may represent a value less than 0 dB. For a color representation "green" may represent "pass", "yellow" may represent "caution" and "red" may represent "fail." Or alternatively the colors may represent particular power levels or code activity levels.

In the most compressed ribbon 10 each stripe 12 may represent a multiplicity of channels/codes, as indicated above, through any decimation method. For instance, if the stripes represent power, a single stripe representing several channels/codes may display maximum power across the several channels/codes or average power. If the stripe represents pass/fail, the decimation method may indicate "fail" if any of the included channels/codes is "fail" and indicate "pass" if all are "pass." The expanded views, either text table or zoomed in ribbon, are useful for viewing the underlying per-channel/code status that is buried by the decimation.

Additionally there may be a draggable box 14 around a set of contiguous stripes 12, or some other visible device to allow a user to select a subset of the channels within the frequency range of interest or codes within a single channel in order to view additional detail. The additional detail may include channel number, signal standard, frequency, etc. or code number, power, spreading factor, etc. The additional detail may be represented in a text table displayed near the status ribbon 10. Also an expanded status ribbon 10' may be displayed where each stripe 12' represents only a single code. Also a line or bar graph may be shown to display detailed values expanded for each individual channel/code in the expansion zone indicated by the window 14.

Thus the present invention provides a status ribbon having stripes for each channel/code or each decimated group of channels/codes with the color or brightness of each stripe indicating a value for a signal parameter or a pass/caution/fail value.

What is claimed is:

1. A display of signal characteristics for multiple channels/codes within a region of interest comprising a status ribbon having a plurality of stripes, each stripe representing at least one channel/code within the region of interest and having a trait representative of a value for the at least one channel/code, and a draggable window encompassing a subset of the channels/codes for which additional detail is desired.

2. The display of claim 1 wherein the trait represents activity for the at least one code where the frequency range of interest is a digital communications radio frequency channel.

3. The display of claim 1 wherein the trait represents a parameter for the at least one code where the frequency range of interest is a digital communications radio frequency channel.

4. The display of claim 1 wherein the value corresponds to a measured power value for a signal parameter of the at least one channel/code.

5. The display of claim 1 wherein the trait represents a condition for a signal parameter of the at least one channel/code.

6. The display of claim 5 wherein the condition is selected from the group consisting of pass and fail.

7. The display of claim 5 wherein the condition is selected from the group consisting of pass, caution and fail.

8. A display of signal characteristics for multiple channels/codes within a frequency range of interest comprising a status ribbon having a band of adjacent stripes of equal length, each stripe representing at least one channel/code within the frequency range of interest and having a trait selected from the group consisting of hue, saturation and brightness representative of a value for the at least one channel/code; and a draggable window encompassing a subset of codes for which additional detail is desired where the frequency range of interest is a digital communications radio frequency channel.

9. The display of claim 8 wherein the value corresponds to a measured power value for a signal parameter of the at least one channel/code.

10. The display of claim 8 wherein the trait represents a condition for a signal parameter of the at least one channel/code.

11. The display of claim 10 wherein the condition is selected from the group consisting of pass and fail.

12. The display of claim 10 wherein the condition is selected from the group consisting of pass, caution and fail.

* * * * *